(12) United States Patent
Kawai

(10) Patent No.: US 11,304,307 B2
(45) Date of Patent: Apr. 12, 2022

(54) PRINTED WIRING BOARD AND METHOD FOR MANUFACTURING PRINTED WIRING BOARD

(71) Applicant: IBIDEN CO., LTD., Ogaki (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/939,540

(22) Filed: Jul. 27, 2020

(65) Prior Publication Data

US 2021/0037660 A1 Feb. 4, 2021

(30) Foreign Application Priority Data

Jul. 30, 2019 (JP) .............................. JP2019-139411

(51) Int. Cl.
*H05K 3/34* (2006.01)
*H05K 1/11* (2006.01)
*H05K 1/09* (2006.01)

(52) U.S. Cl.
CPC ............. *H05K 3/3473* (2013.01); *H05K 1/09* (2013.01); *H05K 1/111* (2013.01); *H05K 3/3452* (2013.01); *H05K 2201/0341* (2013.01); *H05K 2201/0379* (2013.01); *H05K 2203/0465* (2013.01); *H05K 2203/0723* (2013.01); *H05K 2203/1476* (2013.01)

(58) Field of Classification Search
CPC ........ H05K 3/3473; H05K 1/09; H05K 1/111; H05K 3/3452; H05K 2201/0341
USPC .......................................................... 174/257
See application file for complete search history.

(56) References Cited

U.S. PATENT DOCUMENTS

2020/0343169 A1* 10/2020 Tanaka .................... H01L 24/81

FOREIGN PATENT DOCUMENTS

JP 2000-323613 A 11/2000

* cited by examiner

*Primary Examiner* — Tremesha S Willis
(74) *Attorney, Agent, or Firm* — Oblon, McClelland, Maier & Neustadt, L.L.P.

(57) ABSTRACT

A printed wiring board includes a base insulating layer, a conductor layer formed on the base layer and including first and second pads, a solder resist layer formed on the base layer such that the solder resist layer has first opening exposing the first pad and second opening exposing the second pad with diameter smaller than diameter of the first opening, and bumps including a first bump on the first pad and a second bump on the second pad such that the second bump has diameter smaller than diameter of the first bump. The first bump has a base plating layer formed in the first opening and having raised portion, and a top plating layer formed on the base plating layer, and the second bump has a base plating layer formed in the second opening and having raised portion, and a top plating layer formed on the base plating layer.

20 Claims, 4 Drawing Sheets

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2019-139411, filed Jul. 30, 2019, the entire contents of which are incorporated herein by reference.

BACKGROUND OF THE INVENTION

Field of the Invention

The present invention relates to a printed wiring board having plating bumps, and a method for manufacturing the printed wiring board having plating bumps.

Description of Background Art

Japanese Patent Application Laid-Open Publication No. 2000-323613 describes a printed wiring board in which multiple conductor pads are formed in a lowermost layer of a lower layer portion, and a lower surface of the lowermost layer except for the conductor pads is covered by a solder resist layer. Bumps as external connection terminals are respectively formed on the conductor pads. The entire contents of this publication are incorporated herein by reference.

SUMMARY OF THE INVENTION

According to one aspect of the present invention, a printed wiring board includes a base insulating layer, a conductor layer formed on the base insulating layer and including a first conductor pad and a second conductor pad, a solder resist layer formed on the base insulating layer such that the solder resist layer is covering the conductor layer and has a first opening exposing the first conductor pad and a second opening exposing the second conductor pad and having a diameter that is smaller than a diameter of the first opening, and bumps including a first bump formed on the first conductor pad of the conductor layer and a second bump formed on the second conductor pad of the conductor layer such that the second bump has a diameter that is smaller than a diameter of the first bump. The first bump is formed such that the first bump has a first base plating layer formed in the first opening and having a raised portion in an upper central portion thereof, and a first top plating layer formed on the first base plating layer, and the second bump is formed such that the second bump has a second base plating layer formed in the second opening and having a raised portion in an upper central portion thereof, and a second top plating layer formed on the second base plating layer.

According to another aspect of the present invention, a method for manufacturing a printed wiring board includes forming a conductor layer on a base insulating layer such that the conductor layer includes a first conductor pad and a second conductor pad, forming a solder resist layer on the base insulating layer such that the solder resist layer covers the conductor layer and has a first opening exposing the first conductor pad and a second opening exposing the second conductor pad and having a diameter that is smaller than a diameter of the first opening, and forming bumps including a first bump and a second bump such that the first bump is formed on the first conductor pad of the conductor layer and that a second bump is formed on the second conductor pad of the conductor layer and has a diameter that is smaller than a diameter of the first bump. The forming of the bumps includes forming the first bump including a first base plating layer in the first opening and a first top plating layer on the first base plating layer such that the first base plating layer has a raised portion in an upper central portion thereof, and forming the second bump including a second base plating layer in the second opening and a second top plating layer on the second base plating layer such that the second base plating layer has a raised portion in an upper central portion thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
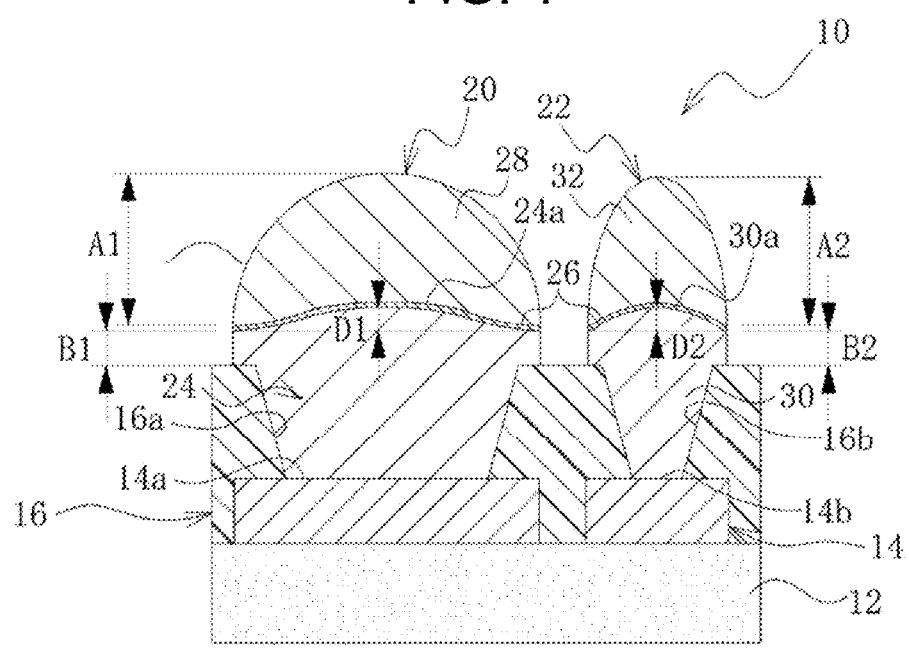
FIG. 1 is a cross-sectional view for describing a printed wiring board of an embodiment of the present invention.

Embodiments will now be described with reference to the accompanying drawings, wherein like reference numerals designate corresponding or identical elements throughout the various drawings.

FIG. 1 illustrates an enlarged view of a portion of a printed wiring board 10 according to an embodiment of the present invention. The printed wiring board 10 may be a substrate with a core formed by alternately laminating conductor layers and resin insulating layers on one side or both sides of a core substrate (not illustrated in the drawings), the conductor layers each having a predetermined circuit pattern. In the case where the conductor layers are formed on both sides of the core substrate, conductor layers opposing each other via the core substrate may be connected to each other via through-hole conductors (not illustrated in the drawings). Alternatively, instead of a core substrate, the printed wiring board 10 may be a coreless substrate obtained by alternately laminating conductor layers and resin insulating layers on a support plate (not illustrated in the drawings) and then removing the support plate. In any case, as illustrated in FIG. 1, the printed wiring board 10 includes at least a base insulating layer 12 which is an outermost resin insulating layer, a conductor layer 14 which is formed on the base insulating layer 12 and has a predetermined circuit pattern, and a solder resist layer 16 which is formed on the base insulating layer 12 and the conductor layer 14. Other multiple conductor layers and multiple resin insulating layers are often alternately formed below the base insulating layer 12, but are omitted in the drawings. However, it is also possible that the printed wiring board 10 is formed from one insulating layer (the base insulating layer 12) and one conductor layer (the conductor layer 14).

The base insulating layer 12 can be formed of, for example, a resin composition or the like containing an inorganic filler such as silica or alumina and an epoxy resin. The conductor layer 14 is formed of a conductive metal, for example, a metal containing copper as a main component.

The solder resist layer 16 has a first opening (16a) exposing a portion of the conductor layer 14 as a first conductor pad (14a) and a second opening (16b) having a smaller diameter than the first opening (16a) and exposing another portion of the conductor layer 14 as a second conductor pad (14b). An aspect ratio of the first opening (16a), that is, a ratio of a depth to a diameter at a bottom thereof can be set to 0.5 or less. An aspect ratio of the second opening (16b), that is, a ratio of a depth to a diameter at a bottom thereof can be set to 0.6 or more.

An underlayer may be formed on each of the first and second conductor pads (14a, 14b). As the underlayer, a nickel layer formed on a surface of each of the first and second conductor pads (14a, 14b), a palladium layer formed on the nickel layer, and a gold layer formed on the palladium layer can be exemplified. In addition, a nickel layer and a gold layer formed on the nickel layer can be exemplified.

The printed wiring board 10 further includes a first bump 20 which is formed on the first conductor pad (14a), and a second bump 22 which is formed on the second conductor pad (14b) and has a smaller diameter than the first bump 20. The first bump 20 can be used for connecting to a power source or a ground line. The second bump 22 having a smaller diameter than the first bump 20 can be used for connecting to a signal line.

The first bump 20 has a first base plating layer 24 which is formed in the first opening (16a) and has a raised portion in an upper central portion thereof, and a first top plating layer 28 which is formed on the first base plating layer 24 via an intermediate layer 26 containing, for example, nickel as a main component. The intermediate layer 26 preferably has a thickness of 7 µm or less. It is also possible that the intermediate layer 26 is not formed. In the case where the intermediate layer 26 is not formed, the first top plating layer 28 can be formed directly on the first base plating layer 24.

The first base plating layer 24 is formed of a conductive metal, preferably a metal containing copper as a main component. The first base plating layer 24 is preferably formed to a height exceeding a surface of the solder resist layer 16 (a surface on an opposite side with respect to the base insulating layer 12). As a result, the first bump 20 is stably held in the first opening (16a). A thickness (B1) of the first base plating layer 24 measured from the surface of the solder resist layer 16 is preferably within a range of 3 µm-20 µm. The first base plating layer 24 has a first raised portion (24a) in an upper central portion thereof. That is, the upper central portion of the first base plating layer 24 is formed at a position higher than an upper outer peripheral portion thereof. A height (D1) of the first raised portion (24a), that is, a distance from the upper outer peripheral portion of the first base plating layer 24 to a highest position of the first raised portion is 20 µm or less. The height (D1) of the first raised portion (24a) is preferably 15 µm or less, and more preferably 10 µm or less.

The first top plating layer 28 is formed of a metal which has a melting point lower than that of the first base plating layer 24 and which is melted by a reflow treatment and is shaped into a substantially hemispherical shape as illustrated in FIG. 1, for example, a metal containing tin as a main component. A thickness (A1) of the first top plating layer 28 (a distance in a vertical direction from a lower end of the first top plating layer 28 to a top of the first top plating layer on an outer peripheral surface of the first bump 20) is preferably set in a range of 5 µm-45 µm. By setting the thickness (A1) of the first top plating layer 28 in this range, good connection reliability can be obtained between the first bump 20 and a connection pad (not illustrated in the drawings) of an electronic component such as a semiconductor chip or a memory mounted on the printed wiring board 10.

The second bump 22 has a second base plating layer 30 which is formed in the second opening (16b) and has a raised portion in an upper central portion thereof, and a second top plating layer 32 which is formed on the second base plating layer 30 via an intermediate layer 26 containing, for example, nickel as a main component. The intermediate layer 26 preferably has a thickness of 7 µm or less. It is also possible that the intermediate layer 26 is not formed. In the case where the intermediate layer 26 is not formed, the second top plating layer 32 can be formed directly on the second base plating layer 30.

The second base plating layer 30 is formed of a conductive metal, preferably a metal containing copper as a main component. The second base plating layer 30 is preferably formed to a height exceeding the surface of the solder resist layer 16 (the surface on an opposite side with respect to the base insulating layer 12). As a result, the second bump 22 is stably held in the second opening (16b). A thickness (B2) of the second base plating layer 30 measured from the surface of the solder resist layer 16 is preferably within a range of 3 µm-20 µm. The second base plating layer 30 has a second raised portion (30a) in an upper central portion thereof. That is, the upper central portion of the second base plating layer 30 is formed at a position higher than an upper outer peripheral portion thereof. A height (D2) of the second raised portion (30a), that is, a distance from the upper outer peripheral portion of the second base plating layer 30 to the highest position of the second raised portion is the same as or larger than the height (D1) of the first raised portion (24a).

The second top plating layer 32 is formed of a metal which has a melting point lower than that of the second base plating layer 30 and which is melted by a reflow treatment and is shaped into a substantially hemispherical shape as illustrated in FIG. 1, for example, a metal containing tin as a main component. A thickness (A2) of the second top plating layer 32 (a distance in the vertical direction from a lower end of the second top plating layer 32 to a top of the second top plating layer 32 on an outer peripheral surface of the second bump 22) is preferably set in a range of 5 µm-45 µm. By setting the thickness (A2) of the second top plating layer 32 in this range, good connection reliability can be obtained between the second bump 22 and a connection pad (not illustrated in the drawings) of an electronic component such as a semiconductor chip or a memory mounted on the printed wiring board 10.

In an embodiment of the present invention, by forming the first raised portion (24a) in the upper central portion of the first base plating layer 24, in the dissimilar metal interfaces between the first base plating layer 24 and the intermediate layer 26 and between the intermediate layer 26 and the first top plating layer 28, areas of the interfaces are increased as compared to a case where a first base plating layer has a flat surface. As a result, a current density of a current flowing through the interfaces can be reduced and occurrence of electromigration can be suppressed. The same applies to the second base plating layer 30.

In the following, a method for manufacturing the printed wiring board 10 illustrated in FIG. 1 is described with reference to FIGS. 2A-2H.

Figure 2A:
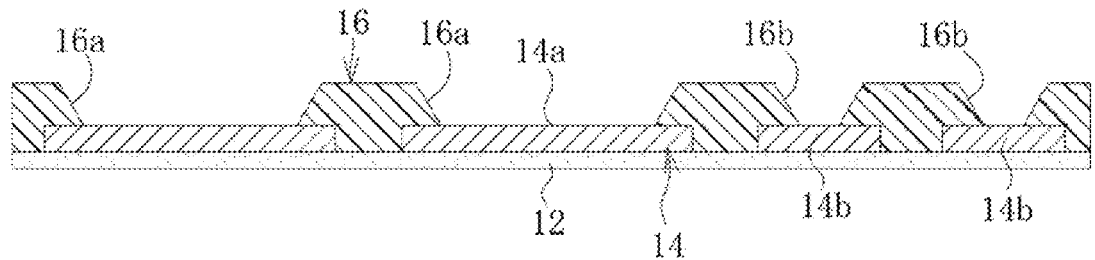
FIG. 2A is a cross-sectional view illustrating a method for manufacturing the printed wiring board of the embodiment of the present invention.

FIG. 2A illustrates an intermediate in which the conductor layer 14 and the solder resist layer 16 are formed on the base insulating layer 12 using a commonly known method, the conductor layer 14 having a predetermined circuit pattern. Other multiple conductor layers and multiple resin insulating layers are often alternately formed below the base insulating layer 12, but are omitted in the drawings. The multiple conductor layers and the multiple resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12. For the base insulating layer 12, an insulating resin film for a build-up layer containing an inorganic filler such as silica or alumina and an epoxy resin can be used. In the solder resist layer 16, for example, using carbon dioxide gas laser or UV-YAG laser or the like, the first opening (16a) exposing a portion of the conductor layer 14 as the first conductor pad (14a) and the second opening (16b) exposing another portion of the conductor layer 14 as the second conductor pad (14b) are formed. The first opening (16a) preferably has an aspect ratio or 0.5 or less and the second opening (16b) preferably has an aspect ratio of 0.6 or more. On each of the first and second conductor pads (14a, 14b), an underlayer may be formed, for example, by laminating in this order a nickel layer, a palladium layer, and a gold layer by plating.

Figure 2B:
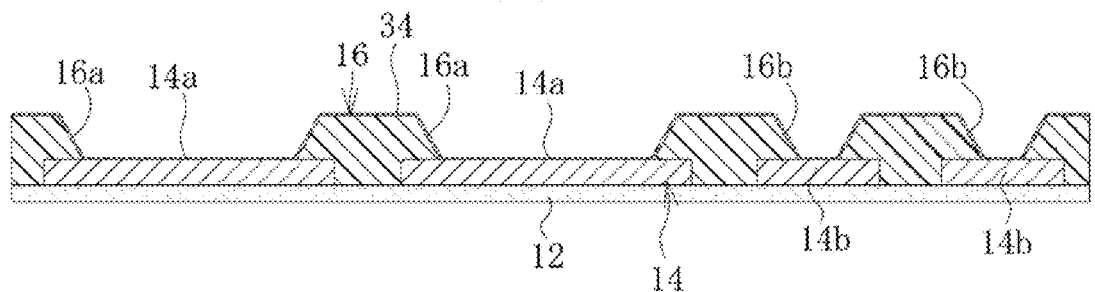
FIG. 2B is a cross-sectional view illustrating the method for manufacturing the printed wiring board of the embodiment of the present invention.

As illustrated in FIG. 2B, for example, an electroless plating treatment such as an electroless copper plating treatment is performed, and a seed layer 34 is formed on a surface of the intermediate (the surface of the solder resist layer 16 and side surfaces of the first and second openings (16a, 16b)) and on the conductor pads (14a, 14b).

Figure 2C:
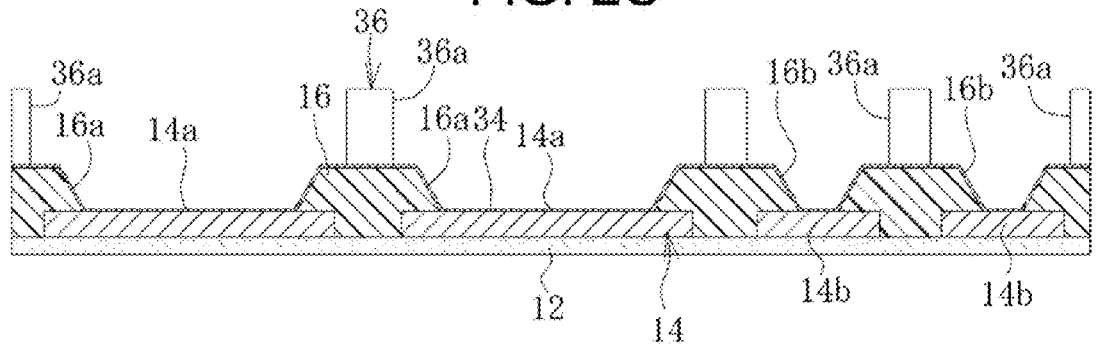
FIG. 2C is a cross-sectional view illustrating the method for manufacturing the printed wiring board of the embodiment of the present invention.

As illustrated in FIG. 2C, on the seed layer 34, a plating resist 36 of a predetermined pattern having openings (36a) at planed formation positions of the first and second bumps (20, 22) (FIG. 1) is formed.

Figure 2D:
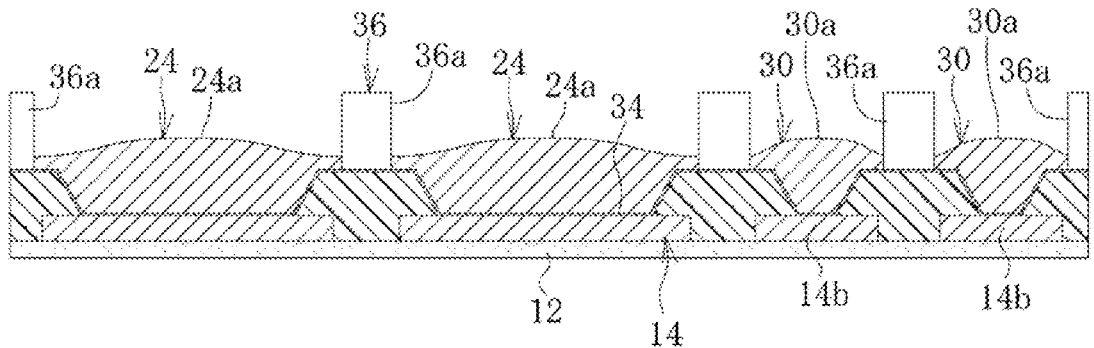
FIG. 2D is a cross-sectional view illustrating the method for manufacturing the printed wiring board of the embodiment of the present invention.

As illustrated in FIG. 2D, an electrolytic plating treatment is performed, and, on portions of the seed layer 34 exposed from the plating resist 36, the first base plating layer 24 and the second base plating layer 30, which each contain, for example, copper as a main component, are formed. In this case, when the printed wiring board 10 illustrated in FIG. 1 is manufactured, a plating thickness of the first base plating layer 24 is adjusted such that the first raised portion (24a) having a height of 20 μm or less, preferably 15 μm or less, more preferably 10 μm or less is formed in the upper central portion thereof. Further, the second raised portion (30a) is adjusted so as to be formed to have the same height as the first raised portion (24a) or be higher than the first raised portion (24a).

Further, when the first and second base plating layers (24, 30) are formed, the plating thicknesses of the first and second base plating layers (24, 30) are preferably adjusted such that the thickness of the first base plating layer 24 and the thickness of the second base plating layer 30, measured from the surface of the solder resist layer 16, are each within a range of 3 μm-20 μm.

Figure 2E:
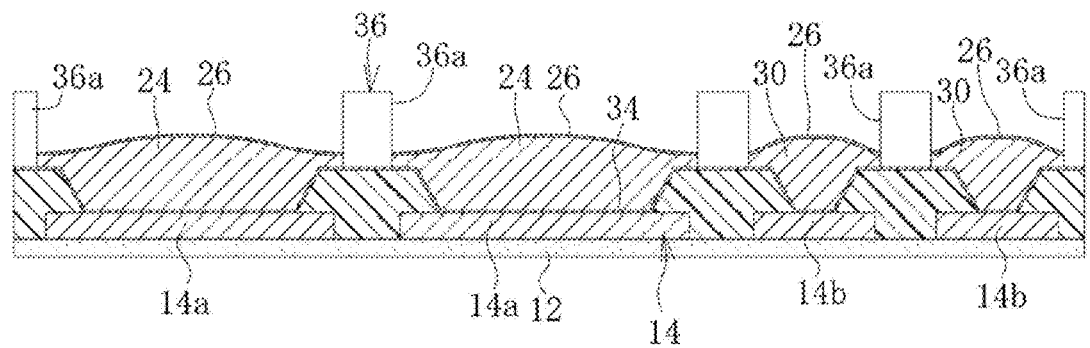
FIG. 2E is a cross-sectional view illustrating the method for manufacturing the printed wiring board of the embodiment of the present invention.

As illustrated in FIG. 2E, for example, an electrolytic plating treatment is performed, and the intermediate layer 26 containing, for example, nickel as a main component is formed on the first and second base plating layers (24, 30). The intermediate layer 26 preferably has a thickness of 7 μm or less. It is also possible that the intermediate layer 26 is not formed.

Figure 2F:
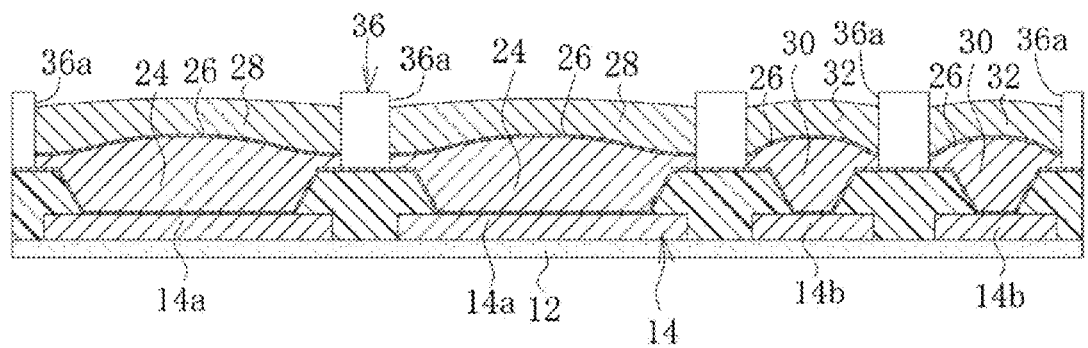
FIG. 2F is a cross-sectional view illustrating the method for manufacturing the printed wiring board of the embodiment of the present invention.

As illustrated in FIG. 2F, an electrolytic plating treatment is performed, and the first and second top plating layers (28, 32) are respectively formed on the first and second base plating layers (24, 30) via the intermediate layers 26. The first and second top plating layers (28, 32) are each formed of a metal which has a melting point lower than that of the first and second base plating layers (24, 30) and which is melted by a reflow treatment and is shaped into a substantially hemispherical shape, for example, a metal containing tin as a main component. The first and second top plating layers (28, 32) preferably each have a thickness in a range of 5-45 μm.

Figure 2G:
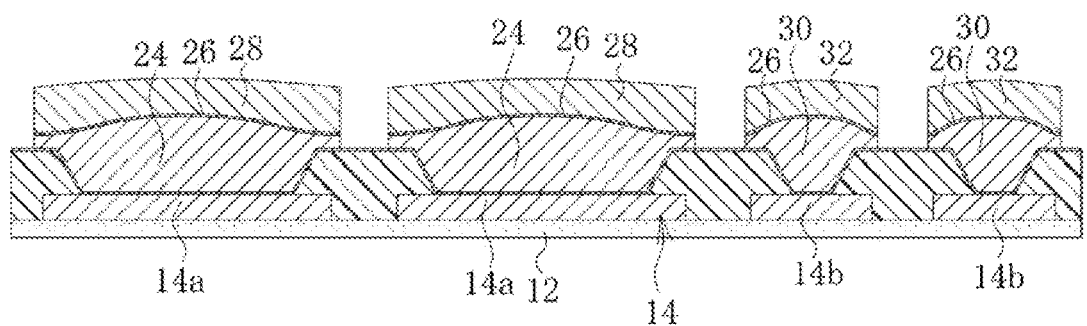
FIG. 2G is a cross-sectional view illustrating the method for manufacturing the printed wiring board of the embodiment of the present invention.

As illustrated in FIG. 2G, the plating resist 36 is peeled off. Further, a portion of the seed layer 34 exposed by the removal of the plating resist 36 is removed by etching.

Figure 2H:
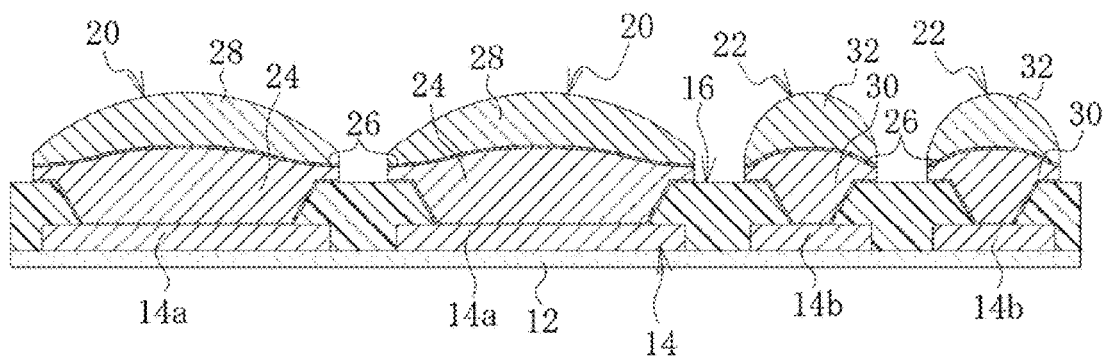
FIG. 2H is a cross-sectional view illustrating the method for manufacturing the printed wiring board of the embodiment of the present invention.

As illustrated in FIG. 2H, a reflow treatment is performed, and the first top plating layer 28 and the second top plating layer 32 are shaped into substantially hemispherical shapes. By the reflow treatment, in the case where the intermediate layer 26 is formed, the first bump 20 and the second bump 22 each including a copper layer, a copper/nickel alloy layer, a nickel layer, a nickel/tin alloy layer and a tin layer from a side close to the first and second conductor pads (14a, 14b) are formed. In the case where the intermediate layer 26 is not formed, the first bump 20 and the second bump 22 each including a copper layer, a copper/tin alloy layer, and a tin layer from a side close to the first and second conductor pads (14a, 14b) are formed.

Figure 3:
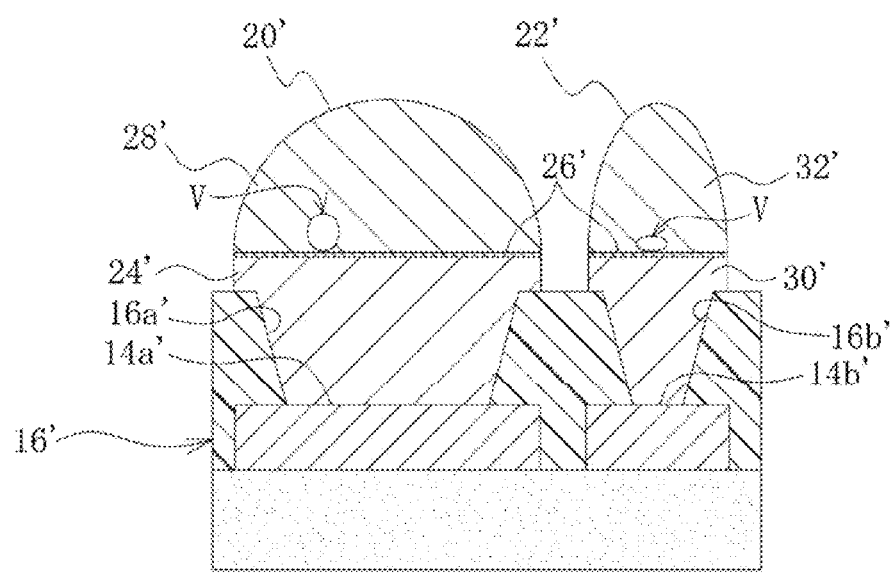
FIG. 3 is a cross-sectional view for describing how voids are generated in bumps in a printed wiring board according to a conventional technology.

Various bump formation methods such as printing, ball mounting, and paste filling are studied. However, in order to cope with a narrow pitch pattern, bump formation using a plating method is effective. However, in bump formation using a plating method, voids may be generated in bumps. As illustrated in FIG. 3, on conductor pads (14a', 14b') in openings (16a', 16b') of different sizes formed in a solder resist layer (16'), bumps (20', 22') of different sizes are respectively formed by forming base plating layers (24', 30') formed of Cu and forming top plating layers (28', 32') formed of Sn on the base plating layers (24', 30') via an intermediate layer (26') formed of Ni.

In this case, when a current density of a current used increases, electromigration due to metal diffusion occurs at dissimilar metal interfaces between the base plating layers (24', 30') formed of Cu and the intermediate layer (26') formed of Ni and between the intermediate layer (26') formed of Ni and the top plating layers (28', 32') formed of Sn. It has been found that voids (V) due to such electromigration are likely to occur in the top plating layers (28', 32').

When voids (V) occur, fractures occur at the interfaces and connection reliability decreases.

A printed wiring board according to an embodiment of the present invention includes: a base insulating layer; a conductor layer formed on the base insulating layer; a solder resist layer that is formed on the base insulating layer and on the conductor layer, and that has a first opening exposing a portion of the conductor layer as a first conductor pad and a second opening exposing another portion of the conductor layer as a second conductor pad, the second opening having a diameter smaller than that of the first opening; a first bump formed on the first conductor pad; and a second bump formed on the second conductor pad, the second bump having a diameter smaller than that of the first bump. The first bump has a first base plating layer formed in the first opening, and a first top plating layer formed on the first base plating layer. The second bump has a second base plating layer formed in the second opening, and a second top plating layer formed on the second base plating layer. The first base plating layer has a raised portion in an upper central portion thereof. The second base plating layer has a raised portion in an upper central portion thereof.

A method for manufacturing a printed wiring board according to another embodiment of the present invention includes: forming a base insulating layer; forming a conductor layer on the base insulating layer; forming a solder resist layer on the base insulating layer and on the conductor layer; forming a first opening in the solder resist layer to expose a portion of the conductor layer as a first conductor pad; forming a second opening in the solder resist layer to expose another portion of the conductor layer as a second conductor pad, the second opening having a diameter smaller than that of the first opening; forming a first bump on the first conductor pad; and forming a second bump on the second conductor pad, the second bump having a diameter smaller than that of the first bump. The forming of the first bump includes: forming a first base plating layer in the first opening; and forming a first top plating layer on the first base plating layer. The forming of the second bump includes: forming a second base plating layer in the second opening; and forming a second top plating layer on the second base plating layer. The forming of the first base plating layer includes forming a first base plating layer having a raised portion in an upper central portion thereof. The forming of the second base plating layer includes forming a second base plating layer having a raised portion in an upper central portion thereof.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a base insulating layer;
a conductor layer formed on the base insulating layer and including a first conductor pad and a second conductor pad;
a solder resist layer formed on the base insulating layer such that the solder resist layer is covering the conductor layer and has a first opening exposing the first conductor pad and a second opening exposing the second conductor pad and having a diameter that is smaller than a diameter of the first opening; and
a plurality of bumps comprising a first bump formed on the first conductor pad of the conductor layer and a second bump formed on the second conductor pad of the conductor layer such that the second bump has a diameter that is smaller than a diameter of the first bump,
wherein the first bump is formed such that the first bump has a first base plating layer formed in the first opening and having a raised portion in an upper central portion thereof, and a first top plating layer formed on the raised portion of the first base plating layer, and the second bump is formed such that the second bump has a second base plating layer formed in the second opening and having a raised portion in an upper central portion thereof, and a second top plating layer formed on the raised portion of the second base plating layer.

2. The printed wiring board according to claim 1, wherein the plurality of bumps is formed such that the raised portion of the second base plating layer in the second bump has a height that is equal to or higher than a height of the raised portion of the first base plating layer in the first bump.

3. The printed wiring board according to claim 1, wherein the plurality of bumps is formed such that the first top plating layer of the first bump has a thickness in a range of 5 µm to 45 µm and that the second top plating layer of the second bump has a thickness in a range of 5 µm to 45 µm.

4. The printed wiring board according to claim 1, wherein the plurality of bumps is formed such that the first base plating layer of the first bump comprises a metal comprising copper forming a main component and that the second base plating layer of the second bump comprises a metal comprising copper forming a main component.

5. The printed wiring board according to claim 1, wherein the plurality of bumps is formed such that the first top plating layer of the first bump comprises a metal comprising tin forming a main component and that the second top plating layer of the second bump comprises a metal comprising tin forming a main component.

6. The printed wiring board according to claim 1, wherein the plurality of bumps is formed such that the first bump has an intermediate layer formed between the first base plating layer and the first top plating layer and comprising nickel forming a main component and that the second bump has an intermediate layer formed between the second base plating layer and the second top plating layer and comprising nickel forming a main component.

7. The printed wiring board according to claim 6, wherein the plurality of bumps is formed such that the intermediate layer of the first bump has a thickness in a range of 7 µm or less and that the intermediate layer of the second bump has a thickness in a range of 7 µm or less.

8. The printed wiring board according to claim 1, wherein the plurality of bumps is formed such that the first base plating layer of the first bump has a height exceeding a surface of the solder resist layer and a thickness measured from the surface of the solder resist layer in a range of 3 µm to 20 µm and that the second base plating layer of the second bump has a height exceeding a surface of the solder resist layer and a thickness measured from the surface of the solder resist layer in a range of 3 µm to 20 µm.

9. The printed wiring board according to claim 1, wherein the solder resist layer is formed such that the first opening has an aspect ratio of 0.5 or less and that the second opening has an aspect ratio of 0.6 or more.

10. The printed wiring board according to claim 2, wherein the plurality of bumps is formed such that the first top plating layer of the first bump has a thickness in a range of 5 µm to 45 µm and that the second top plating layer of the second bump has a thickness in a range of 5 µm to 45 µm.

11. The printed wiring board according to claim 2, wherein the solder resist layer is formed such that the first opening has an aspect ratio of 0.5 or less and that the second opening has an aspect ratio of 0.6 or more.

12. A method for manufacturing a printed wiring board, comprising:
   forming a conductor layer on a base insulating layer such that the conductor layer includes a first conductor pad and a second conductor pad;
   forming a solder resist layer on the base insulating layer such that the solder resist layer covers the conductor layer and has a first opening exposing the first conductor pad and a second opening exposing the second conductor pad and having a diameter that is smaller than a diameter of the first opening; and
   forming a plurality of bumps comprising a first bump and a second bump such that the first bump is formed on the first conductor pad of the conductor layer and that the second bump is formed on the second conductor pad of the conductor layer and has a diameter that is smaller than a diameter of the first bump,
   wherein the forming of the plurality of bumps includes forming the first bump comprising a first base plating layer in the first opening and a first top plating layer on the first base plating layer such that the first base plating layer has a raised portion in an upper central portion thereof and that the first top plating layer is formed on the raised portion of the first base plating layer, and forming the second bump comprising a second base plating layer in the second opening and a second top plating layer on the second base plating layer such that the second base plating layer has a raised portion in an upper central portion thereof and that the second top plating layer is formed on the raised portion of the second base plating layer.

13. The method for manufacturing a printed wiring board according to claim 12, wherein the forming of the plurality of bumps includes forming the raised portion of the first base plating layer in the first bump and the raised portion of the second base plating layer in the second bump such that the raised portion of the second base plating layer in the second bump has a height that is equal to or higher than a height of the raised portion of the first base plating layer in the first bump.

14. The method for manufacturing a printed wiring board according to claim 12, wherein the forming of the plurality of bumps includes forming a thickness of the first top plating layer of the first bump in a range of 5 μm to 45 μm and forming a thickness of the second top plating layer of the second bump in a range of 5 μm to 45 μm.

15. The method for manufacturing a printed wiring board according to claim 12, wherein the forming of the plurality of bumps includes forming the first base plating layer of the first bump such that first base plating layer comprises a metal comprising copper forming a main component and forming the second base plating layer of the second bump such that the second base plating layer comprises a metal comprising copper forming a main component.

16. The method for manufacturing a printed wiring board according to claim 12, wherein the forming of the plurality of bumps includes forming the first top plating layer of the first bump such that the first top plating layer comprises a metal comprising tin forming a main component and forming the second top plating layer of the second bump such that the second top plating layer comprises a metal comprising tin forming a main component.

17. The method for manufacturing a printed wiring board according to claim 12, wherein the forming of the plurality of bumps includes forming an intermediate layer between the first base plating layer and the first top plating layer such that the intermediate layer comprises nickel forming a main component and forming an intermediate layer between the second base plating layer and the second top plating layer such that the intermediate layer comprises nickel forming a main component.

18. The method for manufacturing a printed wiring board according to claim 17, wherein the forming of the plurality of bumps includes forming a thickness of the intermediate layer of the first bump in a range of 7 μm or less and forming a thickness of the intermediate layer of the second bump in a range of 7 μm or less.

19. The method for manufacturing a printed wiring board according to claim 12, wherein the forming of the plurality of bumps includes forming the first base plating layer of the first bump such that a height of the first base plating layer exceeds a surface of the solder resist layer and a thickness of the first base plating layer measured from the surface of the solder resist layer is in a range of 3 μm to 20 μm, and forming the second base plating layer of the second bump such that a height of the second base plating layer exceeds a surface of the solder resist layer and a thickness of the second base plating layer measured from the surface of the solder resist layer is in a range of 3 μm to 20 μm.

20. The method for manufacturing a printed wiring board according to claim 12, wherein the forming of the solder resist layer includes forming the first opening such that the first opening has an aspect ratio of 0.5 or less, and forming the second opening such that the second opening has an aspect ratio of 0.6 or more.

* * * * *